United States Patent
Agami et al.

(10) Patent No.: US 6,859,505 B2
(45) Date of Patent: Feb. 22, 2005

(54) METHOD, APPARATUS AND SYSTEM FOR USE IN DETERMINING PILOT-TO-DATA POWER RATIO IN WIRELESS COMMUNICATION

(75) Inventors: Gregory Agami, Arlington Heights, IL (US); Robert John Corke, Glen Ellyn, IL (US); George Powley, Northborough, MA (US)

(73) Assignee: Motorola, Inc., Schaumburg, IL (US)

( * ) Notice: Subject to any disclaimer, the term of this patent is extended or adjusted under 35 U.S.C. 154(b) by 68 days.

(21) Appl. No.: 10/611,760

(22) Filed: Jul. 1, 2003

(65) Prior Publication Data

US 2005/0002478 A1 Jan. 6, 2005

(51) Int. Cl.[7] .............................................. H04J 13/04
(52) U.S. Cl. ................. 375/345; 455/235.1; 455/245.1; 375/346
(58) Field of Search ................................. 375/345, 346, 375/261, 324; 455/232.1, 235.1, 245.1

(56) References Cited

U.S. PATENT DOCUMENTS

| | | | |
|---|---|---|---|
| 6,430,214 B1 | * | 8/2002 | Jalloul et al. ............... 375/147 |
| 6,724,719 B1 | * | 4/2004 | Tong et al. ................. 370/209 |
| 2004/0110525 A1 | * | 6/2004 | Black et al. ................ 455/522 |

* cited by examiner

Primary Examiner—Amanda T. Le (57) ABSTRACT

A method, apparatus and system for use in determining a pilot-to-data power ratio by receiving a data symbol (122) having a data amplitude, receiving a pilot signal (124) having a pilot amplitude, reverse training (350) an automatic gain (154) based on the data amplitude and the pilot amplitude, and determining a pilot-to-data power ratio (250) according to the reverse training of the automatic gain. In some embodiments the method further compensates for channel fading in the data symbol by providing for channel correction (340) on the data symbol, providing for channel correction (344) on the pilot signal and dividing the channel corrected data symbol by the channel corrected pilot signal providing a fading compensated data symbol, where the fading compensated data symbol (150) is provided prior to reverse training such that the reverse training is based at least in part on the fading compensated data symbol.

18 Claims, 4 Drawing Sheets

METHOD, APPARATUS AND SYSTEM FOR USE IN DETERMINING PILOT-TO-DATA POWER RATIO IN WIRELESS COMMUNICATION

FIELD OF THE INVENTION

The present invention relates generally to wireless communication, and more particularly to determining a pilot-to-data power ratio for quadrature amplitude modulation (QAM) signals.

BACKGROUND OF THE INVENTION

Communication systems that use a pilot signal are known. A pilot signal typically comprises a signal of known character that a receiving device can utilize to better interpret and decode other signals as are transmitted in conjunction with the pilot signal. As such, the pilot signal in particular can be utilized to facilitate adjustment of various reception processing parameters to compensate, at least in part, for channel conditions.

In some wireless communication systems, a power ratio between a wirelessly communicated data signal and a wirelessly communicated pilot signal is needed to accurately scale received wirelessly communicated signals. Typically, the pilot-to-data power ratio is also wirelessly communicated by previous systems over an additional channel. The use of this additional channel requires the use of additional bandwidth and additional transmitting power. Receiving devices must also include additional circuitry and processing capability to accurately receive and decode the wirelessly received pilot-to-data ratio.

Communicating the ratio over a wireless channel will inevitably result in some errors due to the nature of wireless communication. These communication errors will result in lost information or an incorrect ratio may be utilized. Further, the pilot-to-data ratio is frequently adjusted multiple times within a single frame. This requires that the pilot-to-data ratio be wirelessly communicated multiple times during a frame. Receiving devices must also include additional complex circuitry in order to receive, decode and utilize the multiple pilot-to-data ratios communicated for each frame over the additional channel.

BRIEF DESCRIPTION OF THE DRAWINGS

The above needs are at least partially met through provision of the method, apparatus, and system for use in determining pilot-to-data power ratio in wireless communication described in the following detailed description, particularly when studied in conjunction with the drawings, wherein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are typically not depicted in order to facilitate a less obstructed view of these various embodiments of the present invention.

DETAILED DESCRIPTION

These various embodiments provide for methods, systems and equipment or apparatuses that can be used to determine a pilot power versus data power ratio of wirelessly communicated data and pilot signals without an additional communication of the ratio from a transmitting device. The ratio of pilot to data power is useful for properly scaling received amplitude modulated signals and/or symbols. For example, the power to data ratio is utilized within a wireless system to properly scale quadrature amplitude modulated (QAM) symbols in order to forward the symbols onto a QAM decision grid and to optimally support Hybrid-Automatic Repeat Request (HARQ) systems. These embodiments can be utilized in substantially any wireless communication system (IS-95 based or otherwise) using amplitude modulation and/or QAM, such as CDMA2000 C (EVDV), HSDPA, 3G products and other similar communication systems.

Previous wireless systems usually communicate the pilot-to-data power ratio over a control sub-channel, requiring the use of additional bandwidth and additional transmitting power. Further, receiving devices were typically required to include additional circuitry and processing capability to receive, extract, decode and properly apply the received pilot-to-data ratio. Additionally, with the communication of information and/or data over a channel, the communication will experience a corresponding channel error rate. Forwarding the pilot-to-data ratio over a channel will often result in errors, causing the loss of entire frames of information and/or potentially applying an incorrectly received ratio. Communicating the pilot-to-data ratio over an additional channel also usually requires additional transmit power. Receiving devices must include additional complex circuitry in order to receive, decode and utilize the received pilot-to-data ratio communicated over the additional channel.

A preferred embodiment determines the ratio of the pilot-to-data power without the use of an additional forward link sub-channel. The ratio is preferably determined blindly based on the received data signal, the received pilot signal and a known modulation order (e.g., 64 point QAM, 16 point QAM and the like), and in some embodiments, the inherent properties of a QAM signal. This reduces the control sub-channel bandwidth and power requirements and/or frees up bandwidth and power. These embodiments further tend to reduce receiver complexity as the receiver no longer is required to decode the pilot-to-data ratio.

Figure 1:
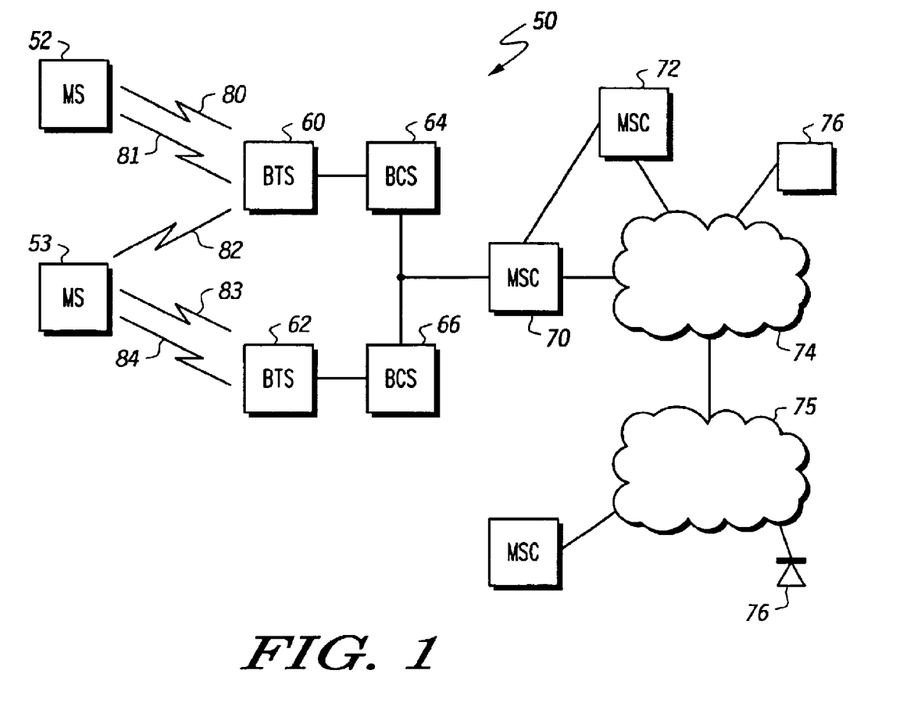
FIG. 1 depicts a simplified block diagram of a wireless communication network according to one embodiment.

FIG. 1 depicts a simplified block diagram of a wireless communication network 50 for use in wireless communication according to one embodiment. The network 50 provides for voice and/or data to be wirelessly communicated to and/or from one or more wireless devices 52–53 (e.g., mobile phones, wireless computers, personal digital assistant (PDA), data or messaging devices, and the like). The network typically includes one or more base stations (BS) or base transceiver stations (BTS) 60, 62 that include wireless transceivers for wirelessly communicating with the wireless devices 52–53. The wireless devices 52–53 and BTSs typically provide for the coding, decoding, error checking and correction, pilot-to-data power ratio determination, frame type determination, power control, wireless transmission and reception and other similar functions.

The BTSs 60, 62 typically couple with one or more base station controllers (BSC) 64, 66 and/or mobile switching centers (MSC) 70, 72. The MSCs can couple with a communication network 74, such as a public switched telephone network (PSTN), integrated services digital network (ISDN), other MSCs 71, other networks and other components of the communication system 50. The communication network 74 can couple with other networks 75.

The present invention is preferably implemented within the wireless devices 52–53 and/or the BTSs 60–62; however, the present invention can additionally or alternatively be implemented in BSCs 64–66, the MSCs 70, and/or other components within the system. Such functionality is probably best implemented with or in software programs and instructions and/or hardware (e.g., integrated circuits (ICs), application specific integrated circuits (ASIC) and the like), such as ASICs implemented in one or more of the wireless devices, BTSs, BSCs, MSCs or other devices of the system. Based on the present disclosure, one skilled in the art will be readily capable of producing and implementing such software and/or hardware without undo experimentation.

The wireless devices 52–53 can communicate with other wireless devices within the system 50, other wireless devices in other wireless systems (not shown), and other hard wired devices 76 (e.g., telephones, servers, computers, and the like). Typically, each wireless device communicates over one or more wireless channel or paths 80–84. Further, each wireless device 52–53 can simultaneously communicate with a plurality of BTSs. Communicating with a plurality of BTSs allows the system to take advantage of handoffs between links and BTSs 60, 62 to optimize the wireless signal quality and/or coverage.

Figure 2:
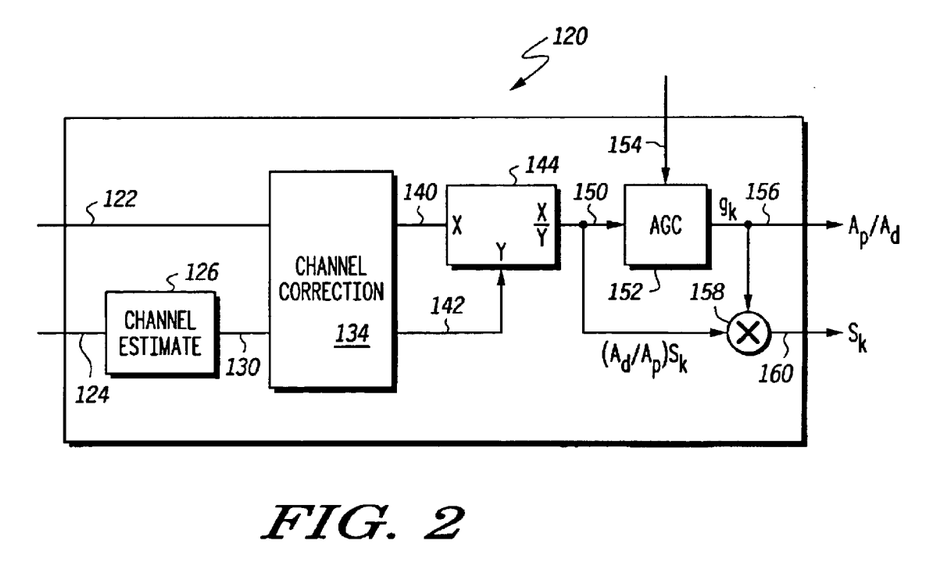
FIG. 2 depicts a simplified block diagram of an apparatus for use in blindly determining the pilot-to-data power ratio that can be implemented in one or more of the components of the wireless network of FIG. 1.

In blindly determining the pilot-to-data power ratio, some embodiments concurrently calculate the pilot-to-data power ratio and scale received modulation symbols. No a-priori knowledge of the pilot-to-data power ratio is required. FIG. 2 depicts a simplified block diagram of an apparatus 120 for use in blindly determining the pilot-to-data power ratio. The apparatus 120 can be implemented in substantially any receiver that utilizes the pilot-to-data power ratio, for example in a wireless device 52–53 and/or a BTS 60, 62. The apparatus includes a first and second input to receive a data signal 122 and a pilot signal 124, respectively. The signals 122, 124 are typically processed symbol by symbol. The data signal includes a plurality of symbols $S_k$ per frame, where k represents one of M number of symbols within a frame. In some circumstances, the same data and/or pilot signals can be communicated over multiple paths or fingers.

Upon transmission of the data and pilot signals, the communication channel(s) typically causes fading on the signals such that the data and pilot symbols and/or signals are channel faded. The fading effects $\alpha_k$ can vary for each received symbol. Further, the data symbols are amplified upon transmission to establish a predefined transmit data amplitude level $A_d$ when transmitted. Similarly, the pilot symbols are amplified to establish a predefined transmit pilot amplitude level $A_p$ when transmitted.

The pilot and/or data signals can additionally pick up noise $\eta_k$ along the communication channel(s). The pilot signal 124 is applied to a channel estimator 126. The channel estimator, in part, reduces and preferably eliminates the noise $\eta_k$ on the pilot signal resulting in a channel adjusted pilot signal 130. This embodiment further includes a channel correction compensator 134. The channel correction compensator 134 provides channel corrections based at least in part on the channel fading $\alpha_k$ per symbol producing a channel corrected data symbol and/or signal 140, and a channel corrected pilot signal or channel fading coefficient 142.

Both of the channel corrected data and pilot signals 140, 142 are forwarded to a channel fading removal or compensating device 144. The channel fading removal device divides the channel corrected data signal 140 by the channel corrected pilot signal 142, resulting in a fading compensated symbol and/or signal 150 where the amplitude of the fading compensated signal 150 is approximately the ratio of the data gain $A_d$ to pilot gain $A_p$ (i.e., $\sim A_d/A_p$). The fading compensated signal 150 is forwarded to an automatic gain control (AGC) device 152. The AGC 152 additionally receives a reference signal 154. The reference signal is typically defined by the receiving device incorporating the pilot-to-data ratio apparatus 120 based on the predefined modulation order (e.g., 16 QAM, 64 QAM, and the like).

Based on the reference signal and fading compensated signal (which is proportional to the data to pilot ratio $A_d/A_p$, the AGC 152 generates a gain ($g_k$) 156 that compensates for the data to pilot ratio. Thus, the AGC gain 156 is substantially equal to the inverse of the data to pilot ratio producing the desired pilot-to-data power ratio $A_p/A_d$. The fading compensated signal 150 can additionally be forwarded to a multiplier 158 to be multiplied by the gain 156 to retrieve the data symbols $S_k$ and/or signal 160.

Figure 3:
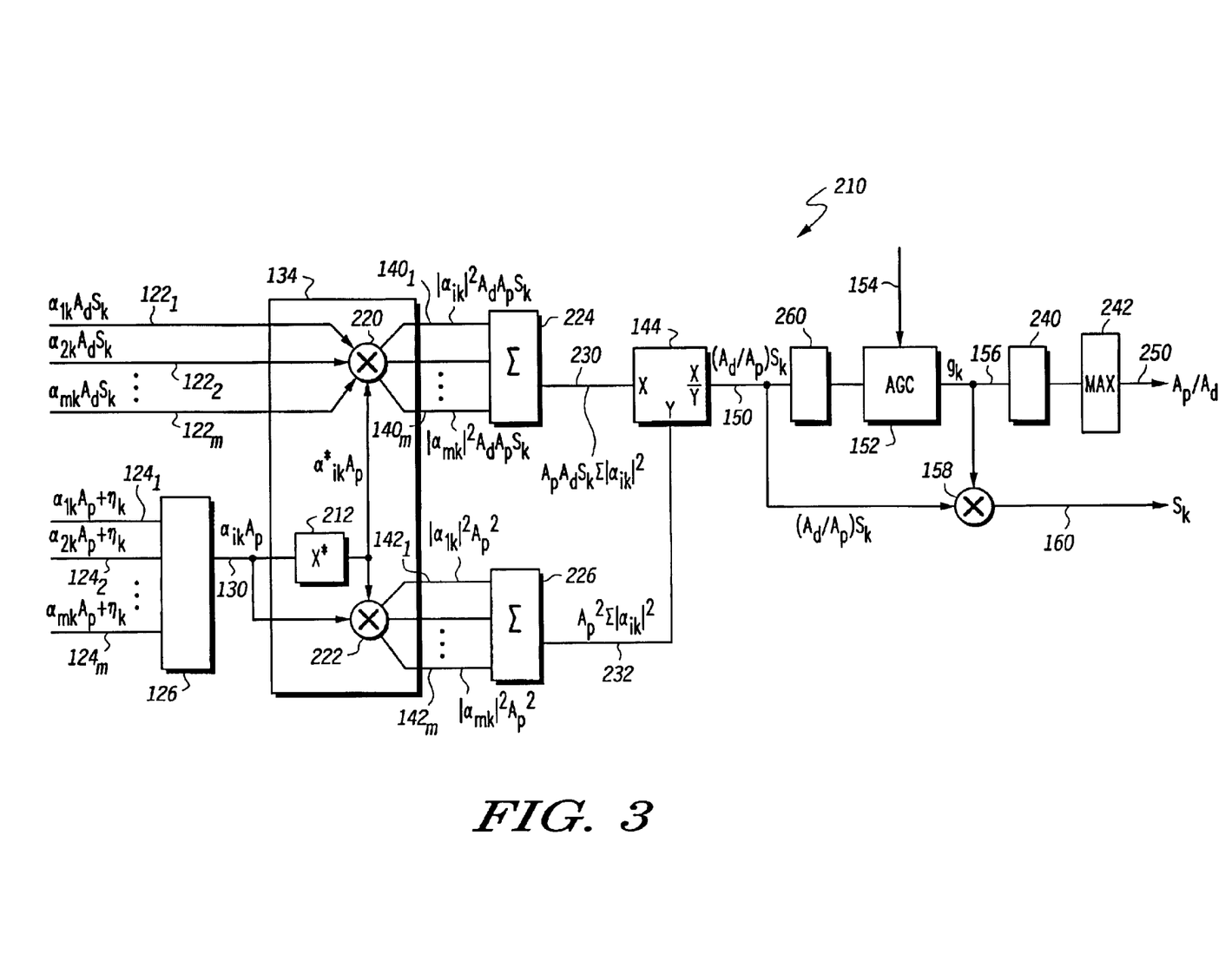
FIG. 3 depicts an alternate embodiment of a pilot-to-data ratio determination apparatus that can be implemented in one or more of the components of the wireless network of FIG. 1.

FIG. 3 depicts an alternate embodiment of a pilot-to-data ratio determination apparatus 210. Again, the apparatus 210 receives the data and the pilot symbols and/or signals 122 and 124, respectively. A channel estimator 126 provides noise $\eta_k$ reduction and preferably noise elimination in the pilot signal producing the channel adjusted pilot signal 130. Both the data signal 122 and the channel adjusted pilot signal 130 are applied to the channel correction compensator 134.

The channel correction compensator of this embodiment takes a conjugate of the channel estimate or fading ($\alpha_k^*$) 212, producing a conjugate adjusted pilot signal 214. A first multiplier 220 multiples the data symbol or signal 122 by the conjugate adjusted pilot signal 214 to produce the channel corrected data symbol and/or signal 140, which in turn is the amplitude squared of the fading coefficient(s) $|\alpha_{ik}|^2$ and the pilot amplitude $A_p$ times the data amplitude $A_d$ and the actual symbol $S_k$ received ($|\alpha_{ik}|^2 A_p A_d S_k$). A second multiplier 222 further multiplies the conjugate adjusted pilot signal 214 with the channel adjusted pilot signal 130 producing the channel corrected pilot symbol and/or signal 142, which is the amplitude squared of the fading coefficient(s) $|\alpha_{ik}|_2$ times the pilot amplitude squared $A_p^2$.

In many QAM systems and other wireless systems, the data and/or pilot signals are received over multiple paths, due to multi-path transmission, signal reflections and the like. As such, in some embodiments, the apparatus performs the previously described functions or applications (i.e., channel estimation and channel correction) for each i path or finger of N number of paths or fingers, which carry the same data and/or pilot signals and symbols, to produce N number of channel corrected data signals $140_1$–$140_n$ and channel corrected pilot signals $142_1$–$142_n$. A first summing device 224 sums all of the N channel corrected data signals 140 to produce a summed channel corrected data signal 230 ($A_p A_d S_k \Sigma |\alpha_{ik}*|^2$). A second summing device 226 sums all of the N channel corrected pilot signals 142 to produce a summed channel corrected pilot signal 232 ($A_p^2 \Sigma |\alpha_{ik}*|^2$).

A channel fading removal device 144 receives the summed channel corrected data signals 230 and the summed channel corrected pilot signal 232, divides the summed channel corrected data signal 230 by the summed channel corrected pilot signal 232, and produces the fading compensated signal 150. In dividing the summed channel corrected data signal 230 by the summed channel corrected pilot signal 232, the summation of the amplitude squared of the fading effects $|\alpha_k|^2$ cancel resulting in the symbol $S_k$ with an amplitude approximately equal to the ratio of the data amplitude $A_d$ to the pilot amplitude.

The fading compensated signal 150 is forwarded to the AGC 152 where a gain $g_k$ 156 proportional to the inverse of the symbol $S_k$ amplitude is established based on the reference signal 154, which again is typically dependent on the known modulation order. The pilot-to-data determination device determines a pilot-to-data power ratio based on the adjustable gain $g_k$. Further, this gain can be applied to a multiplier 158 to multiply the fading compensated signal 150 to obtain the data symbol $S_k$ and/or signal 160.

Additionally, the AGC 152 alone may not be able to remove the fading effects because the AGC is typically implemented to track slowly enough to obtain the average constellation energy from the symbols $S_k$. This slower tracking conflicts with the condition of tracking fast enough to remove the fading. Therefore, the fading coefficient (derived from the pilot channel) is divided out of each symbol before being passed to the symbol AGC 152.

One consequence of dividing the data symbols $S_k$ by the fading coefficient $\alpha_{ik}$ is an increase in noise power when the fading coefficient $\alpha_{ik}$ is very small. After dividing by the fading coefficient in the channel fading removal device 144, the noise power in each data symbol is proportional to the inverse of the summed amplitude squared of the fading effects $1/(\Sigma |\alpha_{ik}|^2)$, which leads to increased noise in symbols with very low fading coefficients $\alpha_{ik}$, and can additionally result in a large symbol $S_k$ amplitude ($A_d/A_p$).

Some embodiments employ a maximum detector or maximum value selection device 242 for selecting a pilot-to-data ratio 250. As described above, the symbol amplitude ($A_d/A_p$) received at the AGC can be relatively large because of the division by a relatively small channel fading $\alpha_{ik}$. When the channel fading $\alpha_{ik}$ is particularly low, the division of the summed channel corrected data signals 230 by the inverse of the summed amplitude squared of the fading effects $1/(\Sigma |\alpha_{ik}|^2)$ can result in a large symbol amplitude (i.e., fading compensated signal 150). This large symbol amplitude is supplied to the AGC 152. The AGC adjusts the gain $g_k$ to a comparatively small value to compensate for the large symbol amplitude, resulting in an inaccurately small pilot-to-data power ratio 250. Thus, the maximum value selection device 242 is employed in these embodiments to compensate for the effects due to fast variations in the channel fading $\alpha_{ik}$. Some embodiments further include filtering 240 to reduce, and preferably eliminate noise within the gain $g_k$ 156. For example, the filtering 240 can provide low pass filtering. This provides a more accurate pilot-to-data power ratio $A_p/A_d$.

The accuracy of the determined pilot-to-data power ratio $A_p/A_d$ 250 can be further improved by reverse training the AGC 152. Because communication channels experience variations in fading over time, the measured pilot-to-data power ratio may vary throughout a frame. For example, symbols at or near the beginning of a frame may not have the same measured pilot-to-data power ratio as a symbol later in the frame. Further, because the measured pilot-to-data ratio can vary, inaccuracies can result in the AGC gain $g_k$ and/or pilot-to-data ratio if the AGC gain determined for the end of a frame is applied to the beginning of the frame. Typically, wireless communication systems cannot tolerate incorrectly scaling the first one to several symbols of a frame by applying an AGC gain $g_k$ that was determined based on a forward training of the AGC and thus the gain $g_k$ is accurate for symbols at the end of the frame but often not accurate for the symbols at the beginning of a frame.

Preferred embodiments reverse train the AGC so that accurate gains $g_k$ for symbols at the beginning of a frame can be determined and applied to the fading compensated signal 150, resulting in a more accurately determined pilot-to-data power ratio 250 and data symbol $S_k$ 160. In reverse training, the AGC 152 receives and buffers the fading compensated signal 150 in a buffer 260. The buffer 260 can be an independent device external to the AGC or can be internal to the AGC. Once a frame or other predefined portion or duration of the signal 150 is fully buffered, some or all of the buffered fading compensated signal 150 is supplied to the AGC 152 in reverse order. For example, if a frame includes four symbols, the fourth symbol is supplied to the AGC followed by the third symbol, which is followed by the second symbol and finally followed by the first symbol. The AGC then adjusts the gain $g_k$ according to the symbol amplitude of each symbol and/or frame and the reference power 154 to result in a match with the reference power. This allows the AGC to converge to the correct adjustable gain value $g_k$ for the beginning of the frame.

Once the AGC is reversed trained, the gain $g_k$ 156 can accurately be applied to the fading compensated signal 150. Further, the gain can be adjusted or altered to coordinate with the symbols as the symbols of the frame are multiplied by the gain 156 through the multiplier 158. Some embodiments allow for the gain to be adjusted at least once for each symbol of a frame, and some embodiments provide for continuous updating of the gain.

In determining the pilot-to-data power ratio ($A_p/A_d$) 260 however, some embodiments determine the pilot-to-data power ratio and apply a single pilot-to-data ratio for an entire frame. Further, as discussed above the determined pilot-to-data ratio can be the maximum pilot-to-data power ratio for the frame as detected by the maximum detector 242.

Figure 4:
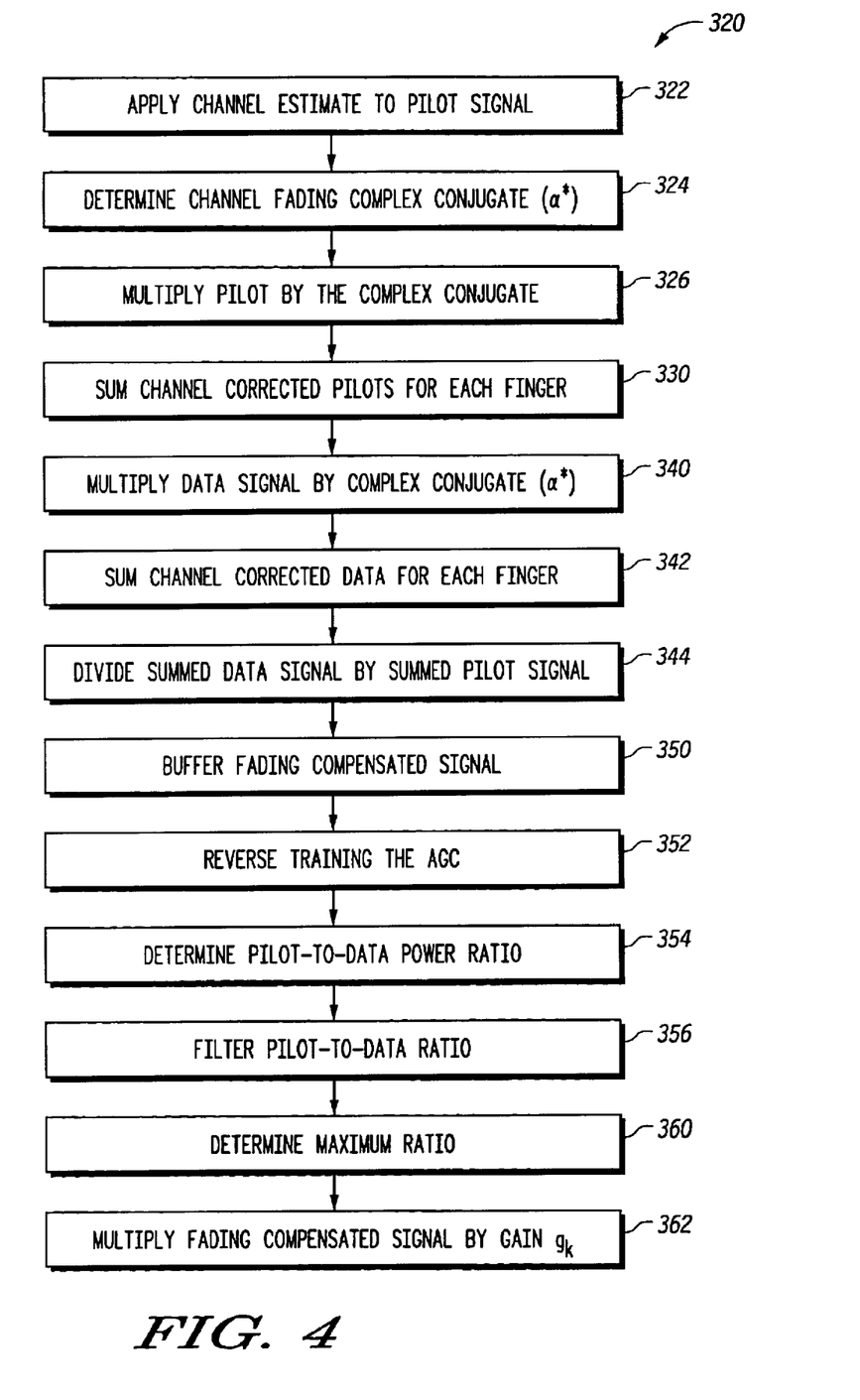
FIG. 4 depicts a simplified flow diagram of a process for blindly determining a pilot-to-data power ratio.

FIG. 4 depicts a simplified flow diagram of a process 320 for blindly determining a pilot-to-data power ratio $A_p/A_d$. In step 322 a channel estimate is applied to a received pilot signal for each finger of a communication link, producing a channel adjusted pilot signal 130 for each finger. The channel estimate can simply provide low pass filtering or can provide more elaborate estimations as is known in the art. In step 324, a complex conjugate of the channel fading $\alpha^*$ is determined for each finger based at least in part on the channel adjusted pilot signal 130. In step 326, the channel adjusted pilot symbol for each finger is multiplied by the respective complex conjugate $\alpha^*$ for each finger, producing channel corrected pilots 142. In step 330, the channel corrected pilots 142 (see FIG. 3) for each finger are summed, producing a summed channel corrected pilot signal 232.

In step 340, a data signal is received for each finger, and each data signal is multiplied by the respective complex conjugate α* of the channel fading for the respective finger, producing channel corrected data signals 140. In step 342, the channel corrected data signals for each finger are summed, producing a summed channel corrected data signal 230. In step 344, the summed channel corrected data signal 230 is divided by the summed channel corrected pilot signal 232, resulting in a fading compensated signal 150.

In step 350, the fading compensated signal is buffered. In step 352, an automatic gain control device (AGC) is reverse trained by forwarding at least a portion of the buffered fading compensated signal to the AGC in a reverse symbol order. In step 354, a pilot-to-data power ratio ($A_p/A_d$) is determined based on the gain $g_k$ determined for the AGC by converging to a gain value according to the reverse symbol order supplied to the AGC. In step 356, the determined pilot-to-data ratio is filtered, for example by a low pass filter, removing noise. In step 360, the pilot-to-data ratio is monitored for a predefined period, and a final pilot-to-data power ratio ($A_p/A_d$) 250 is determined as a maximum pilot-to-data power ratio detected by the maximum detector during the predefined period. The final pilot-to-data ratio can be utilized by the receiving device for any number of operations.

Some embodiments utilize the AGC gain $g_k$ generated from the AGC to accurately scale the received symbols $S_k$. The embodiment shown in FIG. 4 additionally includes optional step 362, where the fading compensated signal 150 is multiplied by the determined gain $g_k$, scaling the fading compensated signal to retrieve the original transmitted symbols $S_k$ 160. The process 320 removes fading effects, and simultaneously calculates the pilot-to-data power ratio and scales the received modulation symbols without requiring a-priori knowledge of the pilot-to-data power ratio, allowing the symbols to be, for example, accurately mapped onto a decision grid.

The pilot-to-data power ratio ($A_p/A_d$) can be utilized for several operations and functions within a receiving device. One example of the utilization of the pilot-to-data power ratio is the implementation of Chase combining to achieve a more accurate received signal. If a receiving device (e.g., wireless device 52 of FIG. 1) detects a decoding error, the receiving device in some systems sends a retransmission request or negative acknowledgement (NACK) to the transmitting device (e.g., BTS 60). The transmitting device retransmits the frame or frames upon receipt of the NACK. The detected erroneous packet and the retransmitted frame or frames are combined based on weighting, for example weighting based on the pilot-to-data power ratio, the signal to noise ratio (SNR) of individual bits, received energy values and/or other weighting factors.

Figure 5:
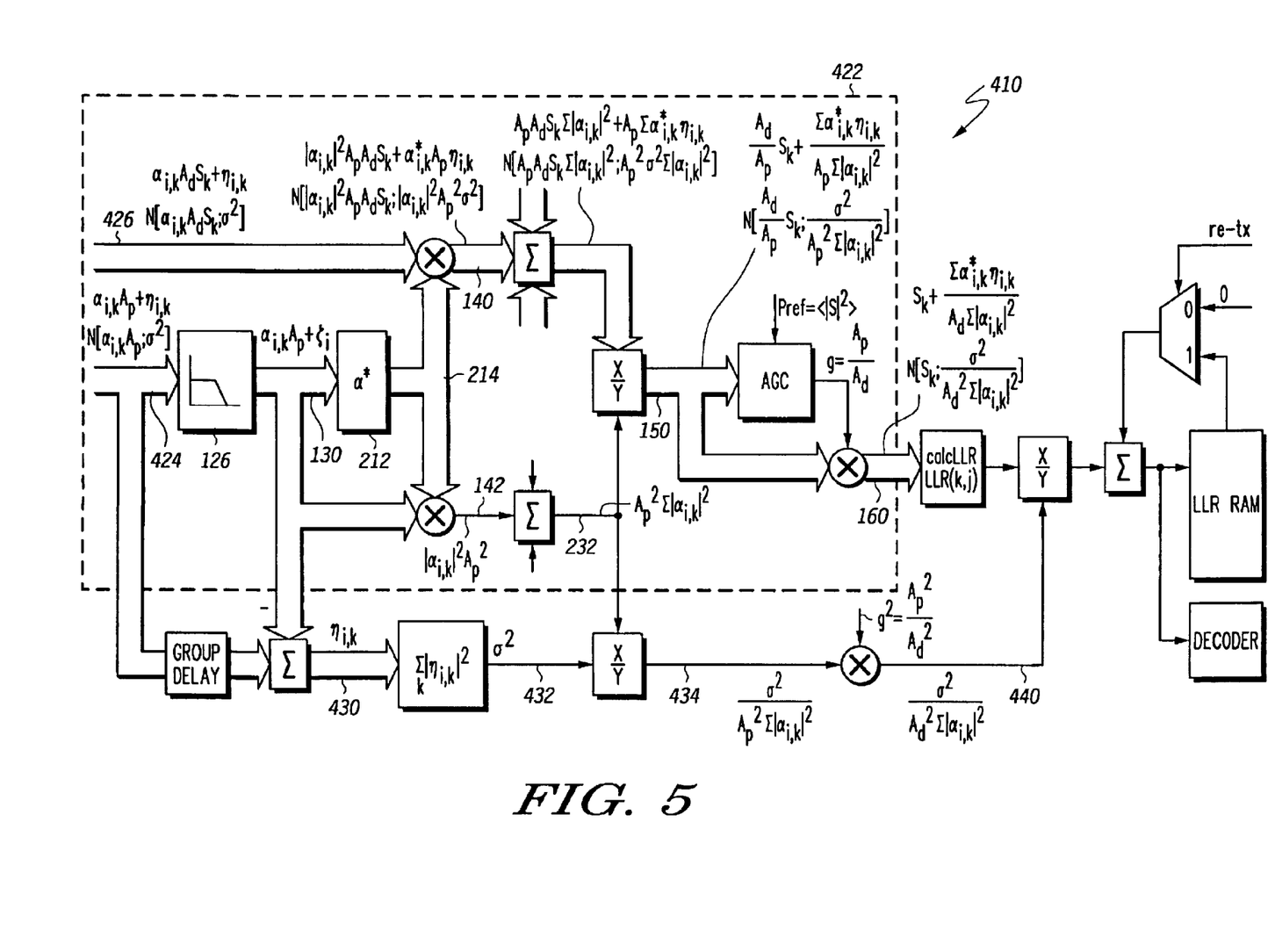
FIG. 5 depicts a simplified block diagram of an embodiment of an apparatus or system for employing Chase combining that utilizes a pilot-to-data determination apparatus, such as that shown in FIG. 3.

FIG. 5 depicts a simplified block diagram of an embodiment of an apparatus or system 420 for employing Chase combining. The system 420 includes a pilot-to-data power ratio system 422 similar to the pilot-to-data ratio system 210 described above in reference to FIG. 3. The system 420 receives the pilot signal 424 and the data signal 426. The pilot-to-data ratio system 422 compensates for noise on the pilot signal through a channel estimator 126. One embodiment employs low pass filtering for at least part of the channel estimation. A conjugate of the estimated channel fading 212 is generated.

Both the data signal 426 and the channel adjusted pilot signal 130 are further multiplied by the conjugate adjusted pilot signal resulting in a channel corrected data signal 140 and a channel corrected pilot signal 142, respectively. The channel corrected data signals from each communication finger or path are summed to obtain the summed channel corrected data signal 230. Similarly, the channel corrected pilot signals from each communication finger or path are summed to obtain the summed channel corrected pilot signal 232. The summed channel corrected data signal is divided by the summed channel corrected pilot signal producing the fading compensated signal 150 which is utilized by the AGC 152 to generate the AGC gain $g_k$ and pilot-to-data power ratio ($A_p/A_d$). The gain is applied to the fading compensated signal to obtain the symbols $S_k$ 160.

The Chase combining system 420 further subtracts the channel adjusted pilot signal 130 from the pilot signal 424 to retrieve the noise 430 from the pilot signal. The amplitude squared of the noise $|\eta_{ik}|^2$ for each symbol of a frame are summed, providing the squared frame noise ($\sigma^2$) 432. The squared frame noise is divided by the summed channel corrected pilot signal 232, resulting in a squared noise pilot adjusted signal 434. The pilot-to-data power ratio is squared and multiplied by the squared noise pilot adjusted signal 434, resulting in a scaling factor 440 approximately equivalent to the squared frame noise $\sigma^2$ over the squared data amplitude $A_d^2$ times the summation of the amplitude squared of the fading effects $\Sigma|\alpha_k|^2$:

$$= \frac{\sigma^2}{A_d^2 \sum |\alpha_{ik}|^2}.$$

The determined symbols $S_k$ 160 obtained through the pilot-to-data power ratio system 422 are utilized in calculating log-likelihood ratio (LLR) coefficients (kj). The LLR coefficients are divided by the scaling factor 440 to provide scaled LLR coefficients that are utilized to combine the data symbols from the initially transmitted frame and the one or more retransmitted frames for the Chase combining process to obtain a more accurate received frame.

Referring back to FIG. 3, some embodiments concurrently calculate the pilot-to-data power ratio and scale the received modulation symbols $S_k$. No a-priori knowledge of the pilot-to-data power ratio is required. The combined channel corrected data symbols 230 are divided by the combined channel corrected pilot symbols 232 and processed by the symbol AGC 152. After channel correction 134 and finger combining 224, the signal can be represented for some embodiments as:

$$x_k = A_d A_p S_k \sum_i |\alpha_{ik}|^2 + A_p \sum_i \alpha_{ik}^* \eta_{ik},$$

where $S_k$ is the $k^{th}$ QAM symbol, $A_p$ is pilot amplitude, $A_d$ is data amplitude, $\alpha_{ik}$ is the channel estimate for the $i^{th}$ finger, $k^{th}$ symbol, and $\eta_{ik}$ is the estimate noise for the $i^{th}$ finger, $k^{th}$ symbol. The fading mitigation and preferably removal 144 produces the fading compensated signal, which can be represented as:

$$y_k = \frac{x_k}{A_p^2 \sum_i |\alpha_{ik}|^2} = \frac{A_d}{A_p} S_k + \frac{\sum_i \alpha_{ik}^* \eta_{ik}}{A_p \sum_i |\alpha_{ik}|^2}.$$

These operations remove the fading effects, generate the pilot-to-data ratio 250 and allow for the mapping of the symbol onto a decision grid. The AGC 152 adjusts the instantaneous AGC gain $g_k$ such that:

$$g_k^2\left(\frac{A_d^2}{A_p^2}<s^2>+\frac{\sigma^2}{A_p^2\sum_f|\alpha_{ik}|^2}\right)=P_{ref}=<s^2>,$$

or $$g_k^2=\frac{<s^2>}{\left(\frac{A_d^2}{A_p^2}<s^2>+\frac{\sigma^2}{A_p^2\sum_i|\alpha_{ik}|^2}\right)}.$$

As described above, the AGC alone may not remove the fading effects because the AGC tracks slow enough to obtain the average constellation energy from, for example, a QAM symbols. This slow tracking conflicts with the desire to track fast enough to remove the fading effects. Therefore, the fading coefficient 142, 232 (derived from the pilot channel) is divided out 144 of each symbol before being passed to the symbol AGC 152, which can lead to increased noise in symbols with very low fading α.

The AGC 152 uses the training mode, typically run at the beginning of each frame. In the training mode, some or all of the frame is processed through the AGC in reverse order, adjusting the gain to match the reference power, which is known for example from the MCS information provided. The training mode sets the AGC gain to the correct value for the first symbol and/or symbols at the beginning of the frame.

The pilot-to-data gain ratio is estimated, typically for an entire frame, as the maximum value of the low-pass filtered instantaneous gains generated during the training mode for a predefined period, such as a frame period. The maximum value is utilized to remove effects due to fast variations in the fading $\alpha_{ik}$, to yield the pilot-to-data power ratio for a frame.

$$\gamma=\frac{A_p}{A_d}.$$

The instantaneous gain $g_k$, which continues to be updated in forward processing mode of the AGC 152 is applied to each QAM symbol $S_k$ to scale the symbols, for example to the decision grid. Again, the pilot-to-data power ratio $A_p/A_d$ for a given frame may be used to perform maximum ratio combining required for Chase combining for HARQ, and other similar processing.

While these embodiments have been described by means of specific embodiments and applications thereon numerous modifications and variations could be made thereto by those skilled in the art without departing from the scope of the invention set forth in the claims.

What is claimed is:

1. A method for use in determining a pilot-to-data power ratio, comprising:
   receiving a data symbol having a data amplitude;
   receiving a pilot signal having a pilot amplitude;
   reverse training an automatic gain based on the data amplitude and the pilot amplitude; and
   determining a pilot-to-data power ratio according to the reverse training of the automatic gain.

2. The method of claim 1, further comprising:
   compensating for channel fading in the data symbol providing a fading compensated data symbol prior to reverse training such that the reverse training is based at least in part on the fading compensated data symbol.

3. The method of claim 2, wherein the compensating for channel fading comprises:
   providing for channel correction on the data symbol;
   providing for channel correction on the pilot signal; and
   dividing the channel corrected data symbol by the channel corrected pilot signal providing the fading compensated data symbol.

4. The method of claim 2, further comprising:
   multiplying the fading compensated data symbol by the automatic gain and producing a data symbol.

5. The method of claim 1, wherein the determining the pilot-to-data power ratio comprises determining a maximum pilot-to-data ratio and selecting the maximum pilot-to-data ratio as the pilot-to-data power ratio.

6. The method of claim 5, wherein the determining the pilot-to-data power ratio comprises filtering the pilot-to-data ratio prior to the determining the maximum pilot-to-data ratio and the selecting the maximum pilot-to-data ratio.

7. A method for use in providing wireless communication, comprising:
   receiving a channel faded data signal;
   removing channel fading from the channel faded data signal producing a fading compensated signal;
   reverse training an adjustable gain according to the fading compensated signal;
   generating a pilot-to-data ratio based on the reverse training of the adjusted gain.

8. The method of claim 7, wherein the generating the pilot-to-data ratio comprises:
   monitoring the adjustable gain over a predefined period of time; and
   defining a maximum adjustable gain detected during the predefined period as the pilot-to-data ratio.

9. The method of claim 8, wherein the generating the pilot-to-data ratio further comprises filtering the adjustable gain prior to the monitoring of the adjustable gain.

10. The method of claim 8, further comprising:
    eliminating adjustable gains that exceed predefined thresholds; and
    the defining a maximum adjustable gain as the pilot-to-data ratio comprises ignoring the adjustable gains eliminated.

11. The method of claim 7, further comprising:
    applying the adjustable gain to the data to pilot signal; and
    retrieving a data signal.

12. The method of claim 7, further comprising:
    receiving a channel faded pilot signal;
    providing channel correction comprises:
    determining a complex conjugate of a channel estimate and applying the complex conjugate to the channel faded pilot signal producing a conjugate adjusted pilot signal;
    multiplying the channel faded data signal by the conjugate adjusted pilot signal producing a channel corrected data signal; and
    multiplying the pilot signal by the conjugate adjusted pilot signal producing a channel corrected pilot signal; and
    dividing the channel corrected data signal by the channel corrected pilot signal producing the fading compensated signal.

13. The method of claim 7, further comprising:

receiving a channel faded data signal over a plurality of communication fingers;

receiving a channel faded pilot signal over a plurality of communication fingers;

determining a complex conjugate of a channel estimate for each finger and applying the complex conjugate to the respective channel faded pilot signal for each finger producing a conjugate adjusted pilot signal for each finger;

multiplying the channel faded data signal for each finger by the respective conjugate adjusted pilot signal providing a channel corrected data signal for each finger;

multiplying the channel faded pilot signal for each finger by the respective conjugate adjusted pilot signal providing a channel corrected pilot signal for each finger;

summing the channel corrected pilot signals for each finger producing a summed channel corrected pilot signal;

summing the channel corrected data signals for each finger producing a summed channel corrected data signal; and wherein the removing channel fading from the channel faded data signal comprises dividing the summed channel corrected data signal by the summed channel corrected pilot signal producing the fading compensated signal.

14. The method of claim 13, further comprising:

providing channel estimate correction to the channel faded pilot signal producing a channel adjusted pilot signal prior to the determining the complex conjugate such that the multiplying the channel faded pilot signal by the complex conjugate comprises multiplying the channel adjusted pilot signal by a complex conjugate.

15. An apparatus for use in providing wireless communication, comprising:

a first input receiving a channel faded data symbol;

a channel fading removal device configured to receive the channel faded data symbol and to compensate for the channel fading producing a fading compensated signal;

an automatic gain control (AGC) device coupled with the channel fading removal device, wherein the AGC device receives the fading compensated signal and generates a pilot-to-data power ratio proportional to the fading compensated signal.

16. The apparatus of claim 15, further comprising:

a second input receiving a channel faded pilot signal; and a channel correction compensator coupled with the first and second inputs to receive the channel faded data symbol and the channel faded pilot signal, such that the channel correction compensator provides channel correction to the channel faded data symbol and channel faded pilot signal, wherein the channel fading removal device received a channel corrected data symbol and a channel corrected pilot symbol.

17. The apparatus of claim 15, further comprising:

a maximum detector coupled with the AGC device, wherein the maximum detector detects a maximum pilot-to-data power ratio and selects the maximum pilot-to-data power ratio as the pilot-to-data power ratio.

18. The apparatus of claim 15, further comprising:

a multiplier coupled with the channel fading removal device and the AGC device, wherein the multiplier receives the fading compensated signal and a gain generated by the AGC device such that the gain is proportional to the fading compensated signal, and multiplies the fading compensated signal by the gain to retrieve a data symbol.

\* \* \* \* \*